(12) United States Patent
Chuang et al.

(10) Patent No.: US 7,728,571 B2
(45) Date of Patent: Jun. 1, 2010

(54) LOAD-DEPENDENT FREQUENCY JITTERING CIRCUIT AND LOAD-DEPENDENT FREQUENCY JITTERING METHOD

(75) Inventors: Chao-Hsuan Chuang, Chupei (TW); Cheng-Hsuan Fan, Hsinchu (TW); Hung-Che Chou, Jiadong Township, Pingtung County (TW); Ching-Hsiang Yang, Taoyuan (TW)

(73) Assignee: Richtek Technology Corporation, R.O.C., HsinChu (TW)

( * ) Notice: Subject to any disclaimer, the term of this patent is extended or adjusted under 35 U.S.C. 154(b) by 454 days.

(21) Appl. No.: 11/935,558

(22) Filed: Nov. 6, 2007

(65) Prior Publication Data

US 2009/0115391 A1  May 7, 2009

(51) Int. Cl.
*G05F 1/56* (2006.01)
(52) U.S. Cl. ............... 323/283; 323/285; 323/351
(58) Field of Classification Search ......... 323/282, 323/283, 285, 351; 363/95, 97, 98
See application file for complete search history.

(56) References Cited

U.S. PATENT DOCUMENTS

| | | | | |
|---|---|---|---|---|
| 5,079,498 A | * | 1/1992 | Cleasby et al. ............ 323/283 |
| 5,132,891 A | * | 7/1992 | Kobayashi et al. ....... 363/21.05 |
| 5,432,693 A | * | 7/1995 | Anderson ................... 363/41 |
| 6,600,295 B2 | * | 7/2003 | Kanekawa et al. ......... 323/222 |
| 7,177,166 B1 | * | 2/2007 | Kris, Bryan ................ 363/41 |
| 7,184,283 B2 | * | 2/2007 | Yang et al. ................. 363/41 |
| 7,589,508 B2 | * | 9/2009 | Machesney ................ 323/282 |
| 2006/0285365 A1 | * | 12/2006 | Huynh et al. ............... 363/16 |
| 2007/0210776 A1 | * | 9/2007 | Oka ........................... 323/283 |
| 2008/0129264 A1 | * | 6/2008 | Moussaoui et al. ......... 323/283 |
| 2008/0224678 A1 | * | 9/2008 | Tobin et al. ................ 323/283 |
| 2008/0238391 A1 | * | 10/2008 | Williams et al. ........... 323/283 |
| 2008/0272758 A1 | * | 11/2008 | Melanson .................. 323/283 |
| 2009/0115391 A1 | * | 5/2009 | Chuang et al. ............. 323/283 |

* cited by examiner

*Primary Examiner*—Jeffrey L Sterrett
(74) *Attorney, Agent, or Firm*—Tung & Associates

(57) ABSTRACT

The present invention discloses a load-dependent frequency jittering circuit, comprising: a load condition detection circuit for receiving a switching signal and generating an output according to a load condition; a number generator for receiving the output of the load condition detection circuit and generating a number; a digital to analog converter for converting the output of the number generator to an analog signal; and an oscillator for generating a jittered frequency according to the output of the digital to analog converter.

20 Claims, 5 Drawing Sheets

LOAD-DEPENDENT FREQUENCY JITTERING CIRCUIT AND LOAD-DEPENDENT FREQUENCY JITTERING METHOD

FIELD OF INVENTION

The present invention relates to a frequency jittering circuit and a frequency jittering method, in particular to a frequency jittering circuit and a frequency jittering method to jitter frequency dynamically according to load conditions.

BACKGROUND OF THE INVENTION

To avoid electro-magnetic interference (EMI) generated by high frequency signals, frequency jittering is a method that is often used in high frequency electronic products. Conventionally, frequency jittering is achieved by means of a digital counter; following the counts generated by the digital counter, the frequency shifts within a narrow range. A typical frequency jittering control circuit employing a digital counter may be found in U.S. Pat. No. 6,229,366, which in a simplified form is as shown in FIG. 1: a counter 14 counts the output signal pulses from an oscillator 12, and a digital-to-analog circuit (DAC) 16 generates different signals according to the count of the counter 14. The output of the DAC 16 is fed back to the oscillator 12 to shift its output frequency in a narrow range, which is referred to as "jittered frequency".

Referring to FIG. 2, in a power management chip, the output of the oscillator 12 is usually supplied to a pulse width modulation (PWM) circuit 18; the PWM circuit 18 drives a power stage circuit 20 to convert an input voltage Vin to an output voltage Vout, which is supplied to a load. The power stage circuit 20 for example may be a switching regulator, a fly-back regulator, or any other voltage regulator. Usually it is only in a heavy-load condition that a power switch (not shown) inside the power stage circuit 20 has to switch in high frequency, which requires frequency jittering. In a light-load or no-load condition, frequency jittering is not required, and undesired, because it increases the ripple.

The U.S. Pat. No. 6,229,366 has a drawback that it does not deal with the connection between frequency jittering and load conditions.

SUMMARY OF THE INVENTION

In view of the foregoing drawback in prior art, it is an objective of the present invention to provide a frequency jittering circuit and a frequency jittering method to jitter frequency dynamically according to load conditions.

In accordance with the foregoing and other objectives of the present invention, and from one aspect of the present invention, a load-dependent frequency jittering circuit comprises: a load condition detection circuit for receiving a switching signal and generating an output according to a load condition; a number generator for receiving the output of the load condition detection circuit and generating a number; a digital to analog converter for converting the output of the number generator to an analog signal; and an oscillator for generating a jittered frequency according to the output of the digital to analog converter.

In another aspect of the present invention, a load-dependent frequency jittering method, comprising: receiving a switching signal; generating a digital signal according to a load condition and the switching signal; generating an analog signal according to the digital signal; and changing a frequency of an oscillator according to the analog signal.

The switching signal described in the above includes any analog or digital signal which has at least two states. For example, it can be a PWM signal, a reset signal for defining the PWM signal, a PWM signal which is partially shielded, or a current sensing signal relating to the load.

These and other objectives, aspects, features, and advantages of the present invention will become better understood with regard to the following description, appended claims, and accompanying drawings.

DETAILED DESCRIPTION OF THE PREFERRED EMBODIMENT

Figure 1:
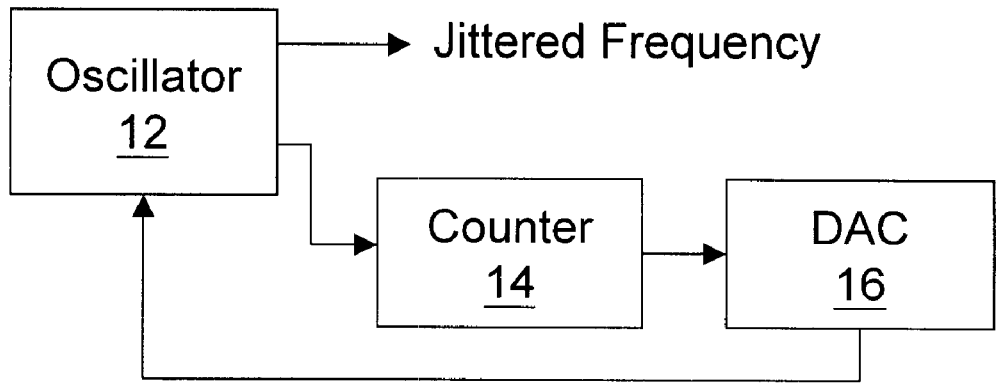
FIG. 1 explains how frequency jittering is performed in prior art.
Figure 2:
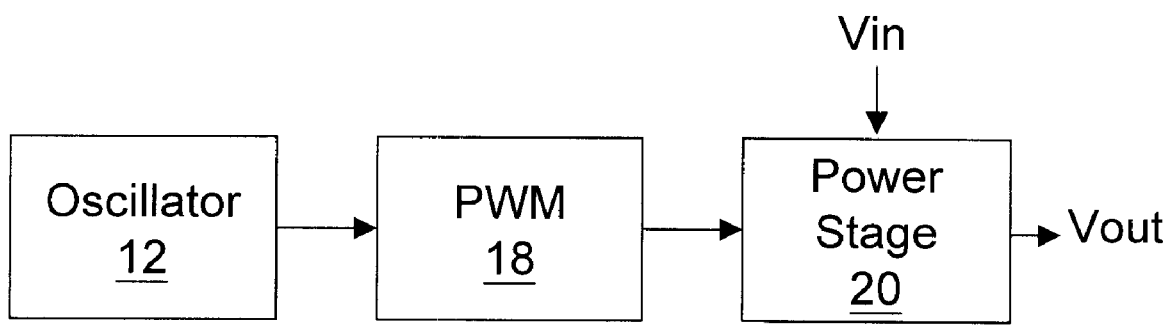
FIG. 2 is a schematic circuit diagram showing how a jittered frequency is supplied to a voltage regulator.
Figure 3:
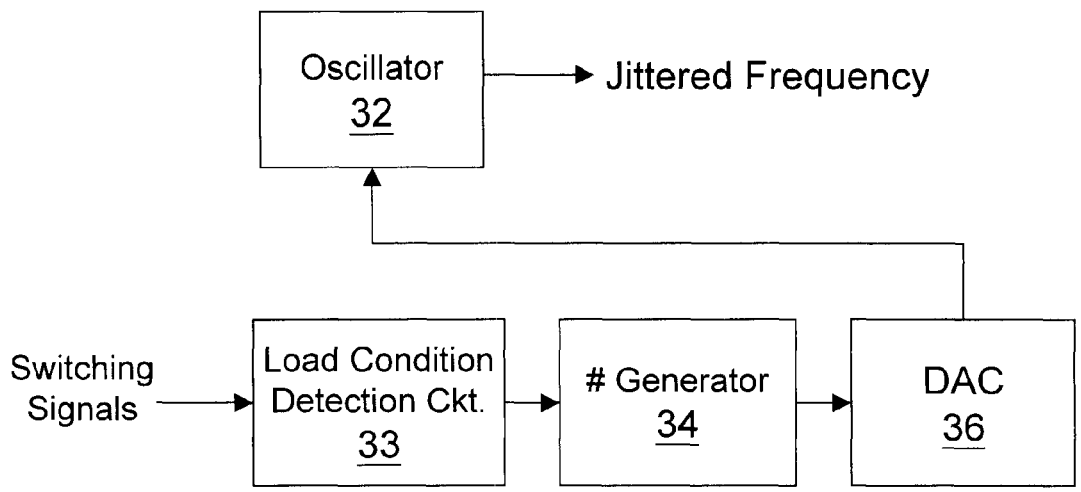
FIG. 3 is a schematic circuit diagram showing the concept of the present invention.

FIG. 3 is a schematic circuit diagram illustrating the concept of the present invention. As shown in the figure, in the present invention, any switching signal can be used to achieve frequency jittering. The term "switching signal" in the context of this specification means any analog or digital signal which has at least two states; more details will be given later. The switching signal is filtered by a load condition detection circuit 33. The load condition detection circuit 33 decides whether to pass the switching signal to a number generator 34 according to load conditions. In one embodiment, the decision is made as such: the switching signal is allowed to pass during the normal-load condition, but is blocked in the light-load or no-load conditions. The output of the load condition detection circuit 33 causes the number generator 34 to generate different numbers; the number generator 34 for example may be a counter, or a random number generator. The output of the number generator 34 drives the DAC 36 to output analog signals, which adjust the oscillator 32 so that it generates jittered frequency.

Figure 4:
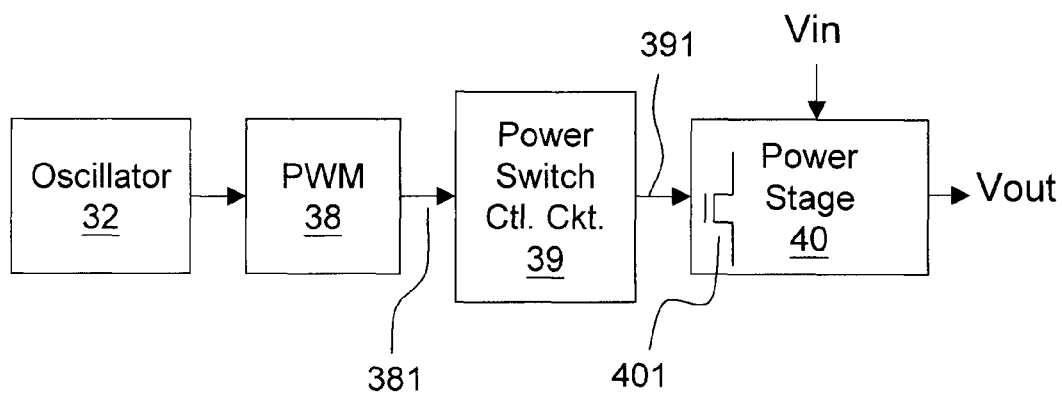
FIG. 4 shows an embodiment of the present invention which is applied to a voltage regulator.

Referring to FIG. 4, the jittered frequency outputted from the oscillator 32 is supplied to a PWM circuit 38 to generate a PWM signal 381. The PWM signal 381 is filtered by a power switch control circuit 39 to generate a gate driving signal 391 which controls a power switch 401 in a power stage circuit 40. In one embodiment with a relatively simple circuit structure, the power switch control circuit 39 is a driver gate. In another embodiment with a more sophisticated circuit structure, the power switch control circuit 39 is provided with a shielding circuit to shield some part of the PWM signal 381. The purpose of shielding is to reduce the switching times of the power switch 401, so as to reduce power conversion loss. The PWM signal 381 may be shielded according to, for example, the pulse skipping mode wherein some of the pulses are periodically skipped, or the burst mode wherein the pulses are allowed to pass in a time period while they are blocked in another time period, as shown in the lower part of the figure.

Figure 5:
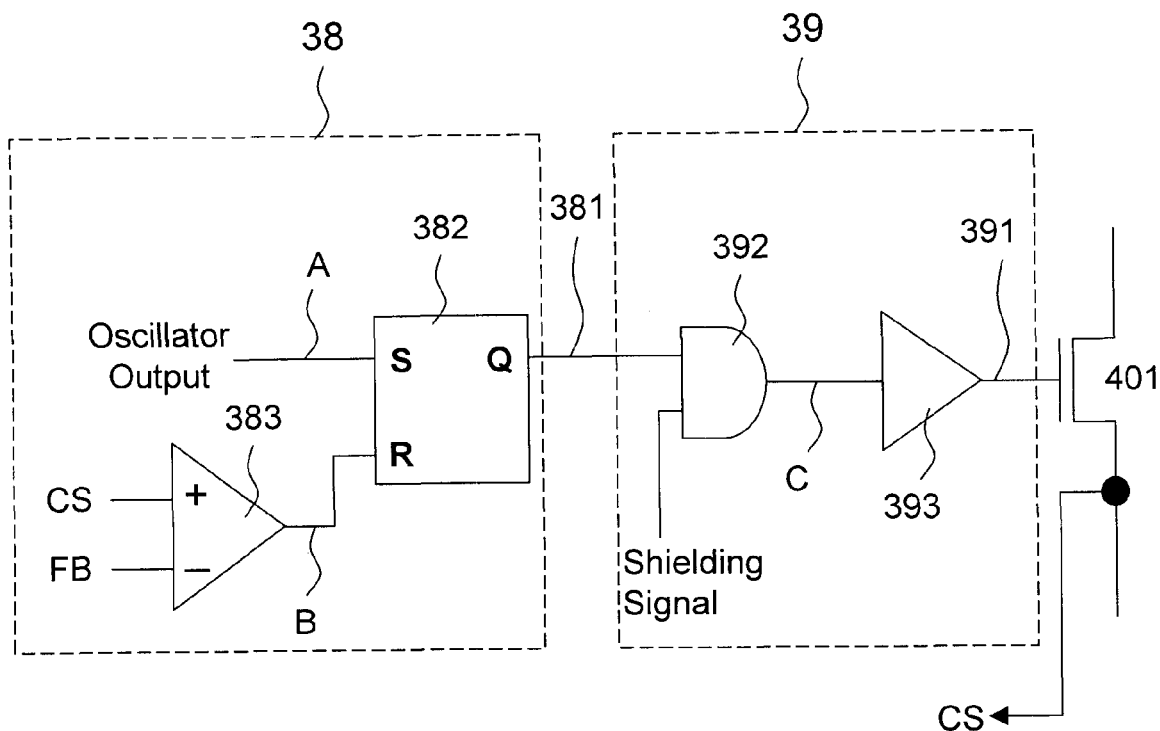
FIG. 5 shows, by way of example, an embodiment of the circuit structure of the PWM circuit and the power switch control circuit in FIG. 4.
Figure 6:
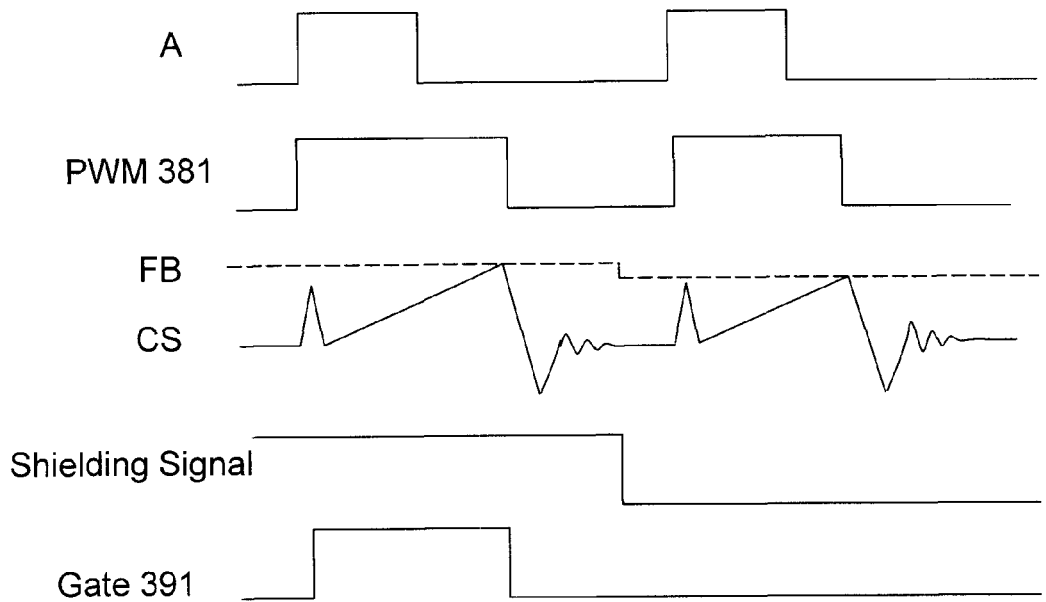
FIG. 6 shows the signal waveforms of the circuit of FIG. 5.

FIG. 5 shows, by way of example, a more detailed structure of the circuit of FIG. 4, and FIG. 6 shows the signal waveforms of the circuit of FIG. 5. As shown in the figure, the PWM circuit 38 includes a latch circuit 382 and a comparator 383. The output (signal A) from the oscillator 32 is sent to the set input S of the latch circuit 382, and therefore the output signal (the PWM signal 381) has a rising edge following the rising edge of the signal A. The comparator 383 compares a current sensing signal CS with a feedback signal FB obtained directly or indirectly from the voltage output terminal. When the current sensing signal CS reaches the voltage level of the feedback signal FB, the comparator 383 outputs a signal triggering the reset input R of the latch circuit 382, and therefore the PWM signal 381 has a falling edge determined by the cross-over point of the current sensing signal CS and the feedback signal FB. The current sensing signal CS and the feedback signal FB are typically provided in a voltage regulator by sensing the current and the voltage at the output terminal. The node for extracting the current sensing signal CS as shown in the figure is only one of many possible locations that may serve the same effect. The feedback signal FB may be obtained directly from the output terminal, or by photo-coupling as well known in this art. What is shown in the figure is, by way of example, a fly-back regulator in which the feedback signal FB is obtained by photo-coupling, so it is in the opposite direction to that of the output voltage Vout, that is, when the load increases and the output voltage Vout drops, the feedback signal EB increases. The details of a fly-back regulator and the photo-coupling mechanism are omitted here because they are well known by those skilled in this art.

In this embodiment, the power switch control circuit 39 includes a shielding circuit 392 and a driver gate 393. In one embodiment, the shielding circuit 392 is an AND gate as shown in the figure, but the same function may be achieved by other means. The shielding circuit 392 is controlled by a shielding signal so that it selectively shields the PWM signal 381, whereby the voltage regulator enters a power saving mode, such as the pulse skipping mode or the burst mode. When the PWM signal 381 is shielded, the gate of the power switch 401 will not be turned ON, as shown in the last two waveforms in the figure. Thus, the switching times of the power switch 401 can be reduced in the light-load condition, to reduce power loss.

Figure 7:
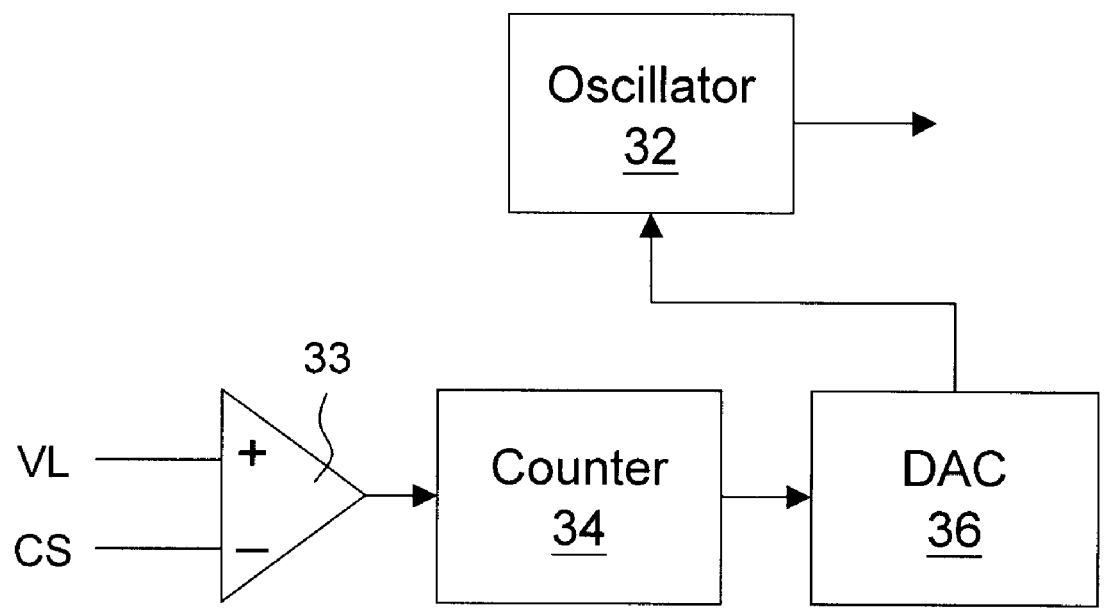
FIGS. 7 and 8 show an embodiment wherein frequency jittering is controlled by a current sensing signal.
Figure 8:
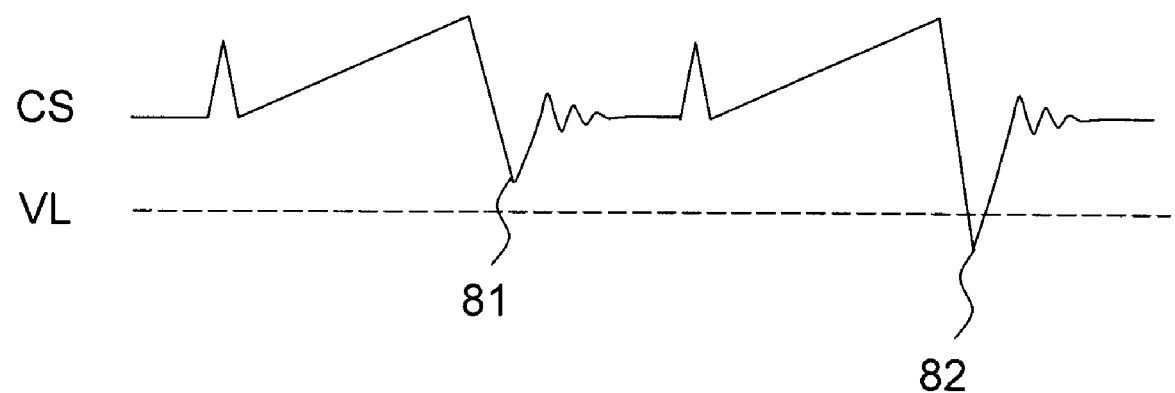

Referring back to FIG. 3 in conjunction with FIG. 5, the switching signal can be anyone of the signals A, B, C, the current sensing signal CS, the signal 381, and the signal 391. Taking the current sensing signal CS as an example, referring to FIGS. 7 and 8, the valley levels (81 and 82) of the current sensing signal CS depend on the load conditions. Hence, the light and heavy load conditions can be differentiated from each other by defining a reference voltage VL. In the embodiment of FIG. 7, the load condition detection circuit 33 is a comparator and the number generator 34 is a counter. The positive input of the load condition detection circuit 33 is the reference voltage VL and the negative input thereof is the current sensing signal CS. Therefore, the load condition detection circuit 33 will output a signal to change the number of the counter 34 (and thus, to jitter the frequency) only when the current sensing signal CS is lower than the reference voltage VL. When the current sensing signal CS is higher than the reference voltage VL, it means that the voltage regulator is operating under a light-load or no-load condition, and frequency jittering is not required.

Figure 9:
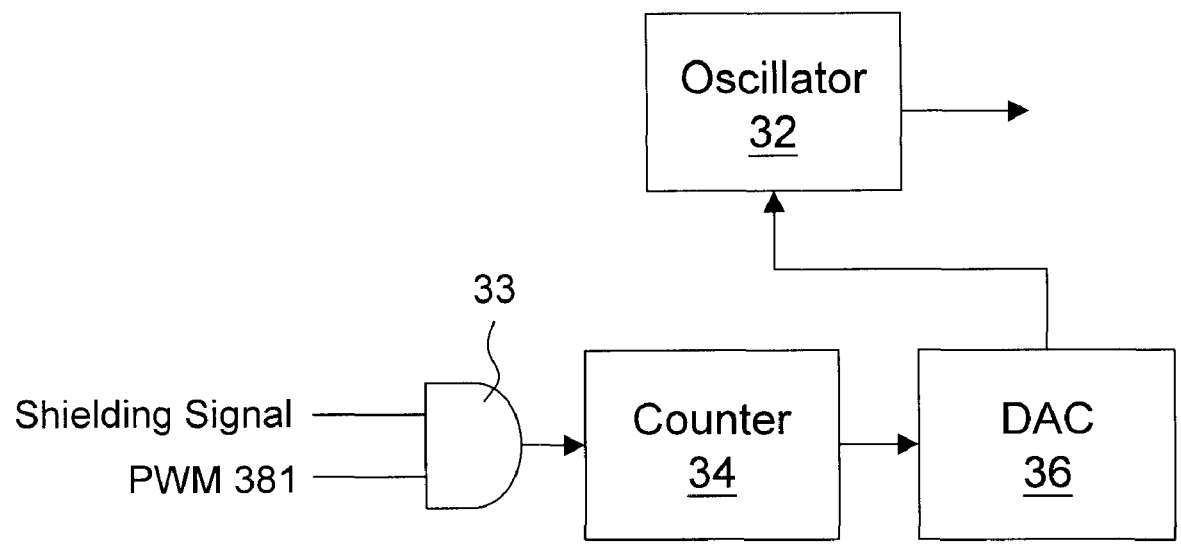
FIGS. 9 and 10 show an embodiment wherein frequency jittering is controlled by a PWM signal.
Figure 10:
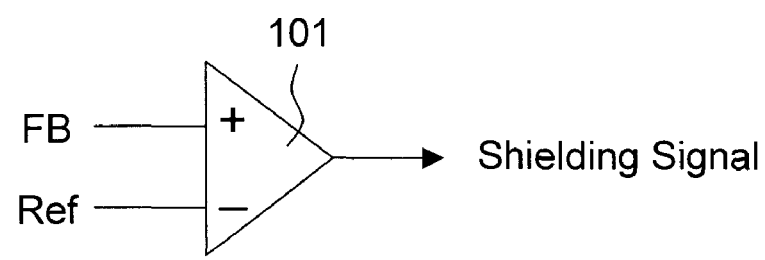

Referring to FIG. 9, in this embodiment, the load condition detection circuit 33 is a logic gate which receives a shielding signal and the PWM signal 381. The shielding signal can be the same as the shielding signal of FIG. 5, or a different one. This shielding signal relates to the load condition; in one embodiment, it can be generated by the circuit shown in FIG. 10. Assuming it is applied to a fly-back regulator, since the feedback signal FB is in the opposite direction to that of the output voltage Vout, but in the same direction as that of the load, it can be arranged such that the feedback signal FB is compared with a reference voltage Ref, whereby in the normal-load condition, the feedback signal FB is higher than the reference voltage Ref, and the comparator 101 outputs a high level signal so that the output of the load condition detection circuit 33 follows the PWM signal 381; on the other hand, in the light-load or no-load condition, the comparator 101 outputs a low level signal so that the output of the load condition detection circuit 33 keeps low, and no frequency jittering is performed.

If the decision whether to perform frequency jittering and decision whether to enter the power saving mode is based on the same criteria, the shielding signal in FIG. 9 can be the same as the shielding signal in FIG. 5; in other words, the counter 34 in FIG. 9 can take the signal C or the gate signal 391 in FIG. 5 as its input. In another case wherein the frequency jittering is required even in the power saving mode, and it is not required only in an even lighter load condition, the shielding signal in FIG. 9 should be different from the shielding signal in FIG. 5, and the reference voltage Ref for the comparator 101 in FIG. 10 should be set lower.

The PWM signal 381 in FIG. 9 can be replaced by the signal B in FIG. 5; this is equivalent to triggering the counter 34 by the falling edge of the PWM signal 381. A similar frequency jittering control effect can be achieved thereby.

Although the present invention has been described in considerable detail with reference to certain preferred embodiments thereof, they are for illustrative purpose rather than for limiting the scope of the present invention. Other variations and modifications are possible. For example, when the feedback signal FB is extracted in a different way such that it has different relationships with the output voltage and the load, the circuit structure of the load condition detection circuit 33 can be correspondingly modified based on the spirit of the present invention. In view of the foregoing, it is intended that the present invention cover all such modifications and variations, which should be interpreted to fall within the scope of the following claims and their equivalents.

What is claimed is:

1. A load-dependent frequency jittering circuit, comprising:
   a load condition detection circuit for receiving a switching signal and generating an output according to a first load condition;
   a number generator for receiving the output of the load condition detection circuit and generating a number;
   a digital to analog converter for converting the output of the number generator to an analog signal; and
   an oscillator for generating a jittered frequency according to the output of the digital to analog converter.

2. The load-dependent frequency jittering circuit of claim 1, wherein the number generator is a counter or a random number generator.

3. The load-dependent frequency jittering circuit of claim 1, further comprising a pulse width modulation (PWM) circuit for receiving the output from the oscillator and generating a PWM signal.

4. The load-dependent frequency jittering circuit of claim 3, wherein the switching signal is an input or output signal of the PWM circuit.

5. The load-dependent frequency jittering circuit of claim 3, further comprising a power switch control circuit which receives the PWM signal and selectively transmits a part of the PWM signal to a power switch according to a second load condition.

6. The load-dependent frequency jittering circuit of claim 5, wherein the power switch control circuit includes a shielding circuit which selectively transmits the part of the PWM signal according to a shielding signal.

7. The load-dependent frequency jittering circuit of claim 6, which is applied to a voltage regulator, the voltage regulator converting an input voltage to an output voltage and supplying the output voltage to a load, wherein the shielding signal is obtained by comparing a feedback signal relating to the output voltage and a first reference voltage.

8. The load-dependent frequency jittering circuit of claim 6, wherein the switching signal is an input or output signal of the PWM circuit, an output signal of the power switch control circuit, or an output signal of the shielding circuit.

9. The load-dependent frequency jittering circuit of claim 5, wherein the switching signal is an input or output signal of the PWM circuit, or an output signal of the power switch control circuit.

10. The load-dependent frequency jittering circuit of claim 3, which is applied to a voltage regulator, the voltage regulator converting an input voltage to an output voltage and supplying the output voltage to a load, wherein the PWM circuit decides the rising edge of the PWM signal according to the output from the oscillator, and decides the falling edge of the PWM signal according to a feedback signal relating to the output voltage and a current sensing signal relating to the load.

11. The load-dependent frequency jittering circuit of claim 10, wherein the switching signal is an input or output signal of the PWM circuit, the current sensing signal relating to the load, or a signal generated by comparing the feedback signal relating to the output voltage and the current sensing signal relating to the load.

12. The load-dependent frequency jittering circuit of claim 1, which is applied to a voltage regulator, the voltage regulator converting an input voltage to an output voltage and supplying the output voltage to a load, wherein the load condition detection circuit compares a current sensing signal relating to the load with a second reference voltage.

13. The load-dependent frequency jittering circuit of claim 1, which is applied to a voltage regulator, the voltage regulator converting an input voltage to an output voltage and supplying the output voltage to a load, wherein the load condition detection circuit includes a shielding circuit which selectively transmits the switching signal according to a shielding signal.

14. The load-dependent frequency jittering circuit of claim 13, wherein the shielding signal is obtained by comparing a feedback signal relating to the output voltage and a third reference voltage.

15. A load-dependent frequency jittering method, comprising:
receiving a switching signal;
generating a digital signal according to a load condition and the switching signal;
generating an analog signal according to the digital signal; and
changing a frequency of an oscillator according to the analog signal.

16. The load-dependent frequency jittering method of claim 15, wherein the step of generating an analog signal according to the digital signal includes: generating a number according to the digital signal, and generating an analog signal according to the number.

17. The load-dependent frequency jittering method of claim 15, which is applied to a voltage regulator, the voltage regulator converting an input voltage to an output voltage and supplying the output voltage to a load, wherein the switching signal is a current sensing signal relating to the load, which is compared with a first reference voltage to generate the digital signal.

18. The load-dependent frequency jittering method of claim 15, which is applied to a voltage regulator, the voltage regulator converting an input voltage to an output voltage and supplying the output voltage to a load, the method further comprising:
deciding the rising edge of the PWM signal according to an output of the oscillator;
deciding the falling edge of the PWM signal according to a feedback signal relating to the output voltage and a current sensing signal relating to the load; and
generating the switching signal by the rising edge or falling edge of the PWM signal.

19. The load-dependent frequency jittering method of claim 18, further comprising: selectively shielding a part of the PWM signal, and generating the switching signal by the rest of the PWM signal that is not shielded.

20. The load-dependent frequency jittering method of claim 19, further comprising: comparing the feedback signal relating to the output voltage with a second reference voltage to determine whether to shield a part of the PWM signal.

* * * * *